(12) United States Patent
Lee et al.

(10) Patent No.: US 10,651,803 B2
(45) Date of Patent: May 12, 2020

(54) TRANSCONDUCTANCE SHIFTED DIFFERENTIAL DIFFERENCE AMPLIFIER

(71) Applicant: TEXAS INSTRUMENTS INCORPORATED, Dallas, TX (US)

(72) Inventors: Seung Bae Lee, Allen, TX (US); Michael Edwin Butenhoff, Minnesota City, MN (US); Sudhir Nagaraj, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 97 days.

(21) Appl. No.: 15/816,369

(22) Filed: Nov. 17, 2017

(65) Prior Publication Data
US 2019/0158033 A1   May 23, 2019

(51) Int. Cl.
*H03F 3/45* (2006.01)
*H03F 1/26* (2006.01)
*H03F 1/34* (2006.01)

(52) U.S. Cl.
CPC ............ *H03F 1/26* (2013.01); *H03F 1/342* (2013.01); *H03F 3/4521* (2013.01); *H03F 3/45* (2013.01); *H03F 2203/45026* (2013.01); *H03F 2203/45288* (2013.01)

(58) Field of Classification Search
CPC .......... H03F 1/26; H03F 1/342; H03F 3/4521; H03F 2203/45288; H03F 2203/45026; H03F 1/34; H03F 3/45; H03F 3/45071; H03F 3/45183; H03F 3/456; H03F 3/45636; H03F 3/45748; H03F 3/45784; H03F 3/45896; H03F 3/45932; H03F 3/45488; H03F 3/04

USPC .................................................. 330/253, 260
See application file for complete search history.

(56) References Cited

U.S. PATENT DOCUMENTS

| 6,538,507 | B2 * | 3/2003 | Prentice | H03F 1/3211 330/134 |
| 8,026,761 | B2 * | 9/2011 | Nolan | H03F 3/45197 330/254 |
| 8,139,957 | B2 * | 3/2012 | Bowler | H03F 1/48 250/214 A |
| 8,319,553 | B1 * | 11/2012 | Ivanov | H03F 1/223 330/253 |
| 2014/0184331 | A1 * | 7/2014 | Thomsen | H03F 3/005 330/260 |
| 2015/0002221 | A1 * | 1/2015 | Van Helleputte | H03F 3/68 330/69 |

* cited by examiner

*Primary Examiner* — Khanh V Nguyen
(74) *Attorney, Agent, or Firm* — Lawrence J. Bassuk; Charles A. Brill; Frank D. Cimino

(57) ABSTRACT

Reducing noise for an amplifier-based system circuit that comprises a first differential input pair and a second differential input pair, a first input stage circuit connected to the first differential input pair, wherein the first input stage is configured with a first transconductance value, a second input stage circuit connected to the second differential input pair, wherein the second input stage is configured with a second transconductance value that is less than the first transconductance value, a transimpedance circuit coupled to the first input stage circuit and the second input stage circuit, and a feedback loop circuit coupled to the transimpedance circuit and to the second differential input pair, wherein the feedback loop circuit is not connected to the first differential input pair.

20 Claims, 5 Drawing Sheets

TRANSCONDUCTANCE SHIFTED DIFFERENTIAL DIFFERENCE AMPLIFIER

BACKGROUND

Output signals from amplifiers generally include desired electrical signals and undesired electrical signals that negatively impact device performance. Examples of undesired electrical signals include noise generated internal and/or external to an amplifier and distortions that occur based on the amplifier's non-linear behavior. For instance, noise external to the amplifier that degrades device performance includes thermal noise originating from active and/or passive circuit components (e.g., resistors). Additionally, flicker noise can be internally generated within the amplifier based on irregularities in transistors' conduction path and bias current. Other types of internally generated noise could be based on an amplifier's voltage and current noise (e.g., voltage-noise density and current-noise density specifications). As a result, circuit designers may consider an amplifier's noise specification when designing and implementing certain system circuits in order to minimize the impact of noise.

One type of amplifier that a circuit designer may use is a differential difference amplifier (DDA). In contrast to a typical operational amplifier that employs a single differential input pair, a DDA has two differential input pairs. Employing a DDA allows a circuit designer to a build complex circuit with a single amplifier component and voltage mode circuits with relatively large input resistance. As an example, by making use of a DDA, a circuit designer could be able to utilize less passive components when building a specific circuit. Unfortunately, similar to other amplifiers, DDAs are also susceptible to the same noise sources. To reduce and minimize the impact of the noise sources, circuit designers are able to increase the bias current and sizes of the input transistors within the DDA. However, increasing the bias current and transistor sizes of the DDA may be impractical in low-power and/or limited chip size design environments, As such, being able to minimize the impact of noise without significantly increasing power consumption and chip size for DDAs remains valuable in improving device performance.

SUMMARY

The following presents a simplified summary of the disclosed subject matter in order to provide a basic understanding of some aspects of the subject matter disclosed herein. This summary is not an exhaustive overview of the technology disclosed herein. It is not intended to identify key or critical elements of the invention or to delineate the scope of the invention. Its sole purpose is to present some concepts in a simplified form as a prelude to the more detailed description that is discussed later.

In one embodiment, an amplifier circuit that comprises a first differential input pair and a second differential input pair, a first input stage circuit connected to the first differential input pair, wherein the first input stage is configured with a first transconductance value, a second input stage circuit connected to the second differential input pair, wherein the second input stage is configured with a second transconductance value that is less than the first transconductance value, a transimpedance circuit coupled to the first input stage circuit and the second input stage circuit, and a feedback loop circuit coupled to the transimpedance circuit and to the second differential input pair, wherein the feedback loop circuit is not connected to the first differential input pair.

In another embodiment, an amplifier-based system circuit comprising: a first input stage circuit configured with a first transconductance value, a second input stage circuit configured with a second transconductance value that is less than the first transconductance value, a transimpedance circuit configured to receive one or more outputs from the first input stage circuit and the second input stage circuit, and a feedback loop circuit configured to provide input signals to a first terminal of the second input stage circuit, wherein the first input stage circuit is configured to not receive input signals from the feedback loop circuit.

In yet another embodiment, a method comprising: receiving, at an amplifier, a first set of input signals at a first differential input pair, wherein the first set of input signals are not from a feedback loop circuit, receiving, at the amplifier, a second set of input signals at second differential input pair, wherein the second set of input signals are from the feedback loop circuit, performing, at the amplifier, a first input stage amplification for the first differential input pair, wherein the first input stage amplification is based on a first transconductance value, and performing, at the amplifier, a second input stage amplification for the first differential input pair, wherein the second input stage amplification is based on a second transconductance value that is less than the first transconductance value, and generating, at the amplifier, one or more output voltages based on the first input stage amplification and the second stage amplification.

BRIEF DESCRIPTION OF THE DRAWINGS

For a detailed description of various examples, reference will now be made to the accompanying drawings in which.

Figure 1:
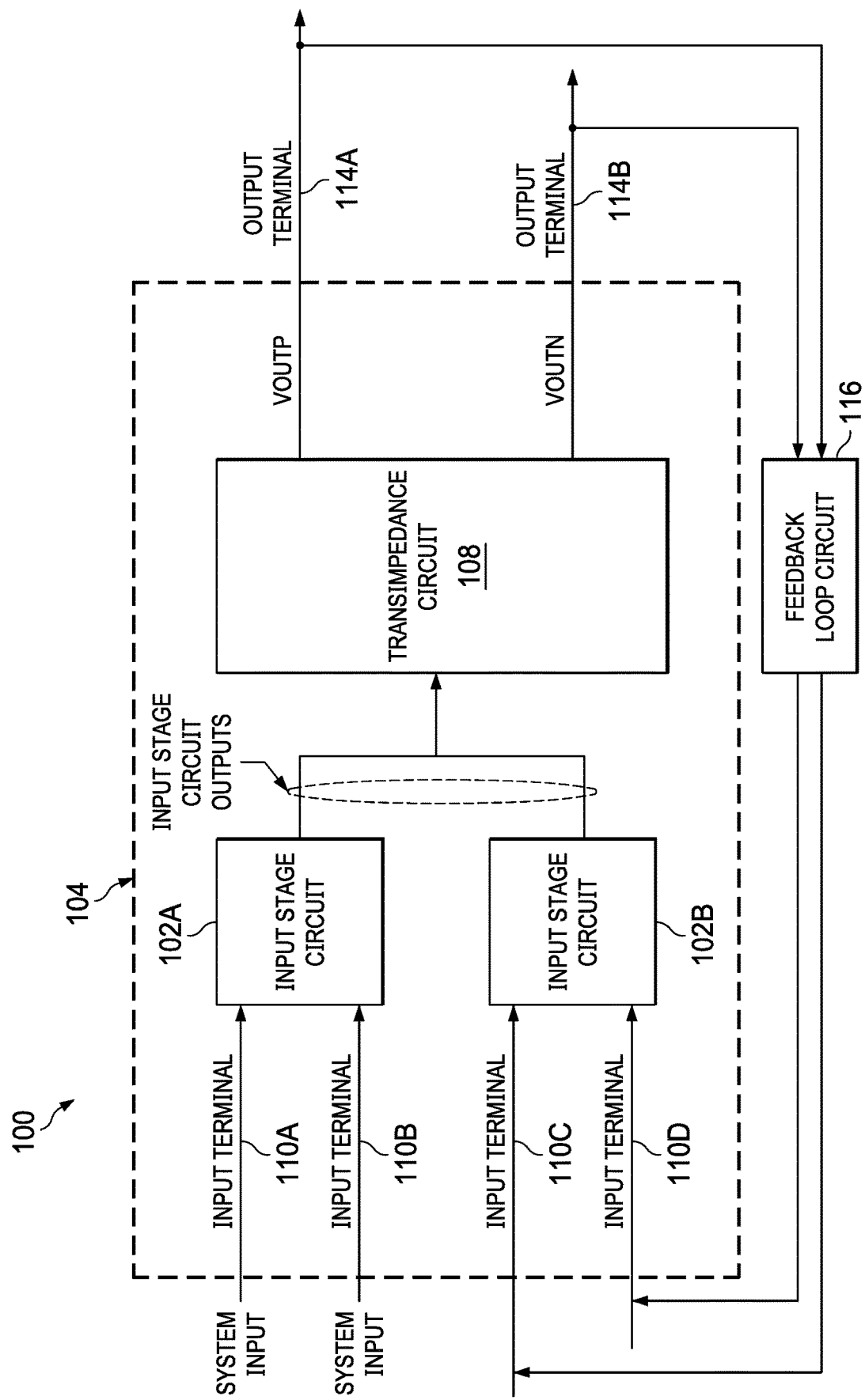
FIG. 1 is a block diagram of an amplifier-based system circuit in accordance with various embodiments.

While certain embodiments will be described in connection with the illustrative embodiments shown herein, the invention is not limited to those embodiments. On the contrary, all alternatives, modifications, and equivalents are included within the spirit and scope of the invention as defined by the claims. In the drawing figures, which are not to scale, the same reference numerals are used throughout the description and in the drawing figures for components and elements having the same structure, and primed reference numerals are used for components and elements having a similar function and construction to those components and elements having the same unprimed reference numerals.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors. The terms "a," "an," and "the" are not intended to refer to a singular entity unless explicitly so defined, but include the general class of which a specific example may be used for illustration. The use of the terms "a" or "an" may therefore mean any number that is at least one, including "one," "one or more," "at least one," and "one or more than one." The term "or" means any of the alternatives and any combination of the alternatives, including all of the alternatives, unless the alternatives are explicitly indicated as mutually exclusive. The phrase "at least one of" when combined with a list of items, means a single item from the list or any combination of items in the list. The phrase does not require all of the listed items unless explicitly so defined.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

Various example embodiments are disclosed herein that reduce the impact of noise and improve the overall gain of a DDA by shifting the transconductance values of the DDA. The DDA contains two input stages, where each input stage connects to two input terminals. The two different input stages are set to have different transconductance values, where a transconductance value can be generally represented throughout this disclosure as "Gm." For example, one of the input stages could have a transconductance value of Gm1 and the other input stage could have a different transconductance value of Gm2. The input stage that receives input from an amplifier-based system circuit at its two input terminal is set to have a relatively larger Gm when compared to the Gm of the input stage that has its input terminals connected to the DDA's two output terminal via a feedback loop circuit. By doing so, the closed loop gain of the DDA increases, and thereby reducing noise without significantly altering power consumption and/or the physical size of the DDA. In one embodiment, the Gm values for the two input stage could be set to a 2:1 or 4:1 Gm ratio. In other words, the Gm of the input stage that receives inputs from the amplifier-based system circuit could be about two or four times larger than the Gm of the input stage that receives inputs via the feedback loop circuit.

FIG. 1 is a block diagram of an amplifier-based system circuit 100 in accordance with various embodiments. As shown in FIG. 1, the amplifier-based system circuit 100 contains a DDA 104 that has four different input terminals 110A, 110B, 110C and 110D, where input terminals 110A and 110B couples to input stage 102A and input terminals 110C and 110D couples to input stage 102B. The two input terminals 110 coupled to a single input stage 102 can be referred throughout this disclosure as a differential input pair. Using FIG. 1 as an example, input terminals 110A and 110B is one differential input pair, and input terminals 110C and 110D is another differential input pair. In FIG. 1, input terminals 110A and 110C represent non-inverted input terminals and input terminals 110B and 110D represent inverted input terminals. In other embodiments, input terminals 110A and 110C could represent inverted input terminals and input terminals 110B and 110D could represent non-inverted input terminals. Input terminals 110A and 110B receive input signals (shown in FIG. 1 as system input) from other portions of the amplifier-based system circuit 100, and input terminals 110C and 110D receive input signals based on the output signals from output terminals 114A and 114B via the feedback loop circuit 116. Output terminals 114A and 114B could provide differential outputs, where output terminal 114A generates the positive output voltage signal Voutp and output terminal 114B generates the negative output voltage signal Voutn.

In contrast to a typical operational amplifier, the DDA 104 is configured to compare differential voltages rather than two input voltage. For example, DDA 104 compares the differential voltage determined from the input terminals 110A and 110B to the differential voltage determined from the input terminals 110C and 110D. This differs from typical operational amplifiers that simply compare the voltages at the two input terminals (e.g., input terminals 110A and 110B). In FIG. 1, based on the comparison of the two differential voltages received at the two differential input pairs, DDA 104 generates two output voltage signals Voutp and Voutn at output terminals 114A and 114B. In other words, DDA 104 is a fully differential amplifier that produces differential outputs. In another embodiment, rather than having two output voltage signals Voutp and Voutn, the DDA 104 could generate a single output voltage signal (e.g., a single ended output). For example, the DDA 104 may generate a single output voltage signal that represents a binary output corresponding to a value of zero or one depending on the differential voltages the input stage circuits 102A and 102B generate.

As shown in FIG. 1, the DDA 104 contains input stage circuits 102A and 102B and a transimpedance circuit 108. The input stage circuits 102A and 102B can act as an amplification stage that utilizes differential amplifier circuits to receive input voltages at the different input terminals 110A-110D. Using differential amplifier circuits, the input stage circuits 102A and 102B can cause a rise in differential currents based on the differences in the input. For input stage circuit 102A, voltage differences at the input terminals 110A and 110B cause a rise in differential currents within the input stage circuit 102A, and voltage differences at the input terminals 110C and 110D cause a rise in differential currents within the input stage circuit 102B. Stated another way, each of the input stage circuits 102A and 102B act as a voltage-to-current stage or a transconductor. The input stage circuits 102A and 102B apply the rise in the differential currents to produce one or more input stage circuit outputs (e.g., a single-ended output and/or differential outputs).

The Gm values for input stage circuits 102A and 102B can be set to differ to reduce noise. In FIG. 1, because the input stage circuit 102A receives inputs from another portion of the amplifier-based system circuit 100 and not from the feedback loop circuit 116, the Gm value is set to be relatively larger than the Gm values for input stage circuit 102B. Setting the Gm value for the input stage circuit 102 to be greater than the input stage circuit 102B increases the overall gain of the DDA 104 and decreases noise. Example embodiments of DDA 104 could have Gm value of the input stage circuit 102A to be about two times or about four times larger than the Gm value of the input stage circuit 102B. A non-limiting example of the input stage circuits 102A and 102B is discussed in more detail in relation to FIG. 3. The input stage circuits 102A and 102B could utilize a variety of differential amplifier circuit designs well-known in the art to account for other variety of design considerations besides shifting Gm values that include, but are not limited to, balancing processing speed and power tradeoffs and/or minimizing process imperfections.

The transimpedance circuit 108 receives the one or more outputs from the input stage circuits 102A and 102B and converts the differential currents into two different voltages on the output terminals 114A and 114B. Within this disclosure, the two different voltages (e.g., +Vout and −Vout) at the output terminals 114A and 114B can be also referred to as differential outputs. In one embodiment, to produce two different voltages on output terminals 114A and 114B, the transimpedance circuit 108 could convert the differential currents from the input stage circuits 102A and 102B to a voltage using resistors and/or a voltage amplifier, such as an operational amplifier. Alternatively, the transimpedance circuit 108 can produce a single-ended output voltage. The transimpedance circuit 108 may also include an output stage circuit that is configured to supply an adequate current to a load without dissipating too much power and provide a relatively low output impedance to allow coupling of a low impedance load without loss of gain. As an example the output stage circuit that generates a suitable output signal can be based on a class AB output stage circuit.

Circuit designers may design and fabricate the DDA 104 using a variety of semiconductor technologies. For example, circuit designers may design the DDA 104 utilizing bipolar complementary metal-oxide-semiconductor (BiCMOS) technology that combines bipolar junction transistors and complementary metal-oxide-semiconductor (CMOS) transistors into an integrated circuit. Combining bipolar junction and CMOS transistors into an integrated circuit allows circuit designers to employ advantages that bipolar junction transistors may have over CMOS transistors and vice versa. For instance, bipolar junction transistors may be able to realize higher voltage gains, perform better at high-frequencies, and have relatively lower output resistance. CMOS transistors, on the other hand, may be able to achieve higher input resistances and relatively lower input bias current, and may be better at implementing low-power logic gates.

Although FIG. 1 illustrates a specific embodiment of a DDA 104 that generates an amplified output signal based on multiple input signals, the disclosure is not limited to the specific embodiment illustrated in FIG. 1. For instance, although FIG. 1 illustrates that the DDA 104 is a two-stage amplifier, the DDA 104 could be implemented with less or more stages shown FIG. 1. The DDA 104 could also include other components not explicitly shown in FIG. 1 that are known by persons of ordinary skill in the art and typically found in amplifier devices. Additionally, other embodiments of the DDA 104 may combine one or more components into a single component. The use and discussion of FIG. 1 is only an example to facilitate ease of description and explanation.

Figure 2:
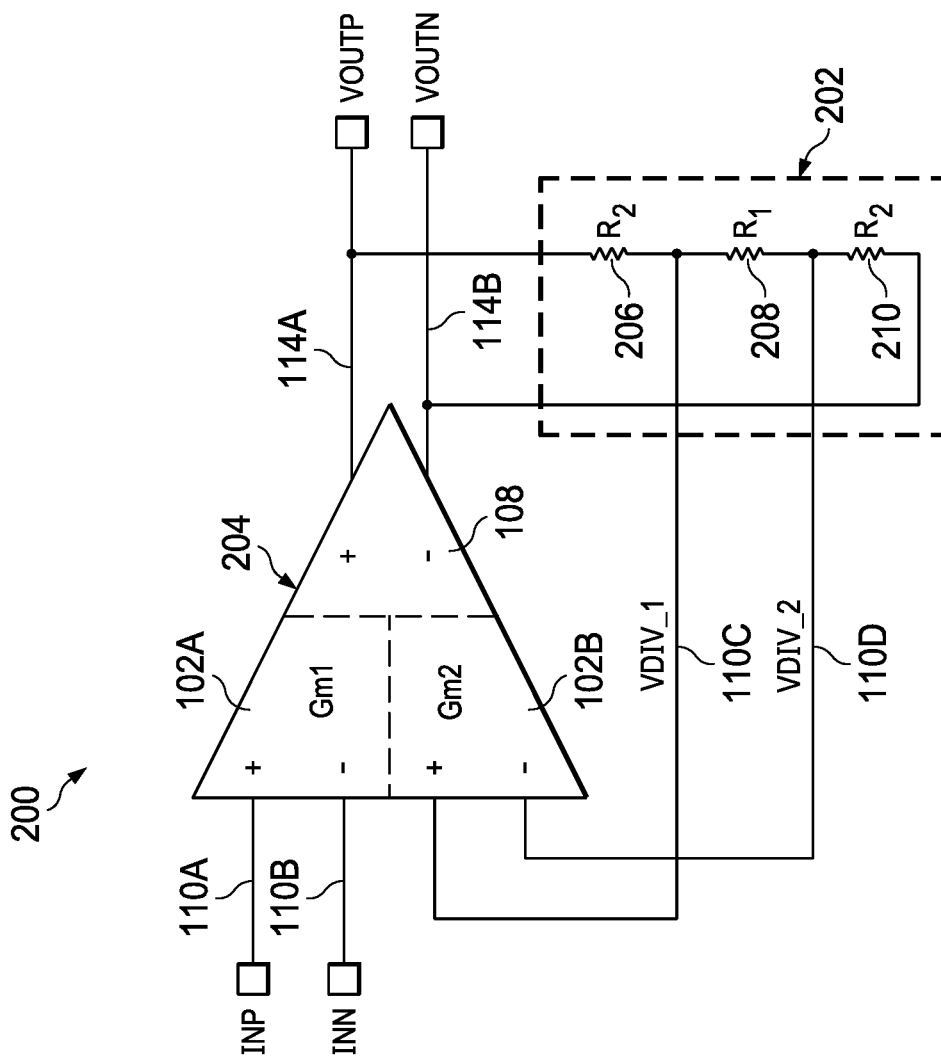
FIG. 2 is a schematic diagram of another embodiment of an amplifier-based system circuit that includes a DDA connected to a feedback loop circuit.

FIG. 2 is a schematic diagram of another embodiment of amplifier-based system circuit 200 that includes a DDA 204 connected to a feedback loop circuit 202. Similar to the DDA 104 shown in FIG. 1, the DDA 204 is a fully differential amplifier that contains input stage circuits 102A and 102B and a transimpedance circuit 108. The input stage circuit 102A receives input signals INP and INN on input terminals 110A and 110B. Recall that input signals INP and INN may originate from other portions of the amplifier-based system circuit 200 not shown in FIG. 2. The input stage circuit 102B has its input terminals 110C and 110D connected to the feedback loop circuit 202. The feedback loop circuit 202 also connects to the output terminals 114A and 114B of the DDA 204. The differential output voltage signals are labeled in FIG. 2 as Voutp and Voutn, where Voutp corresponds to a positive output voltage for output terminal 114A, and Voutn corresponds to negative output voltage for output terminal 114B.

FIG. 2 illustrates that the feedback loop circuit 202 includes three resistors 206, 208, and 210 connected in series and act as voltage dividers. In one embodiment, resistors 206 and 210 have a resistance value of about R2 and resistor 208 has a resistance value of about R1. One side of the resistor 206 connects to the non-inverting output terminal 114A, and the opposite side of resistor 206 serially connects to one side of resistor 208. Additionally, on the side that connects to resistor 208, resistor 206 also connects to the non-inverting terminal 110C. Resistor 210 has one side that serially connects to resistor 208 and to the inverting input terminal 110D. The opposite side of resistor 210 connects to the inverting output terminal 114B. Resistors 206, 208, and 210 may be implemented using a variety of different types of resistors. Examples of resistors include, but are not limited to, carbon composition resistors and semiconductor resistors (e.g., surface mount resistors). Additionally or alternatively, persons of ordinary skill in the art are aware that the feedback loop circuit 202 may use a variety of voltage divider circuits to generate voltage divider values, Vdiv_1 and Vdiv_2 shown in FIG. 2. For example, the feedback loop circuit 202 set the resistance values R1 and R2 using other types of electronic components (e.g., field-effect transistors (FETs) operating in triode region) in lieu of actual resistors.

In FIG. 2, the feedback loop circuit 202 uses resistors 206, 208, and 210 to set the voltages supplied to input terminals 110C and 110D. Specifically, Vdiv_1 supplied to the input terminal 110C (e.g., non-inverting input terminal) is based on the voltage drop across resistor 206 and voltage Vdiv_2 supplied to input terminal 110D (e.g., inverting input terminal) is based on the voltage drop across resistor 208. By performing voltage divides, voltages divider values Vdiv_1 and Vdiv_2 become a fraction of the voltage received from output terminal 114A. From the voltage drops across resistors 206, 208, and 210 within the feedback loop circuit 202, the closed loop gain for DDA 204 can be defined as shown in equation 1 below.

$$A_v = (Gm1/Gm2)(1+(2R2/R1)) \qquad (1)$$

In equation 1 shown above the variable "$A_v$" represents the closed loop gain for DDA 204; Gm 1 represents the transconductance for the input stage circuit 102a; Gm2 represents the transconductance for the input stage circuit 102b; R2 represents the resistance value of resistors 206 and 210; and R1 represents the resistance value of resistor 208. Instead of setting the Gm1 and Gm2 values to be about equal, the DDA 204 shifts the Gm1 and/or Gm2 values to be different from each other. To increase the closed loop gain based on equation 1, Gm1 is set to be larger than Gm2. As an example, the ratio of Gm1/Gm2 can be set to be a 2:1 or a 4:1 ratio to improve the close loop gain and reduce noise.

Figure 4:
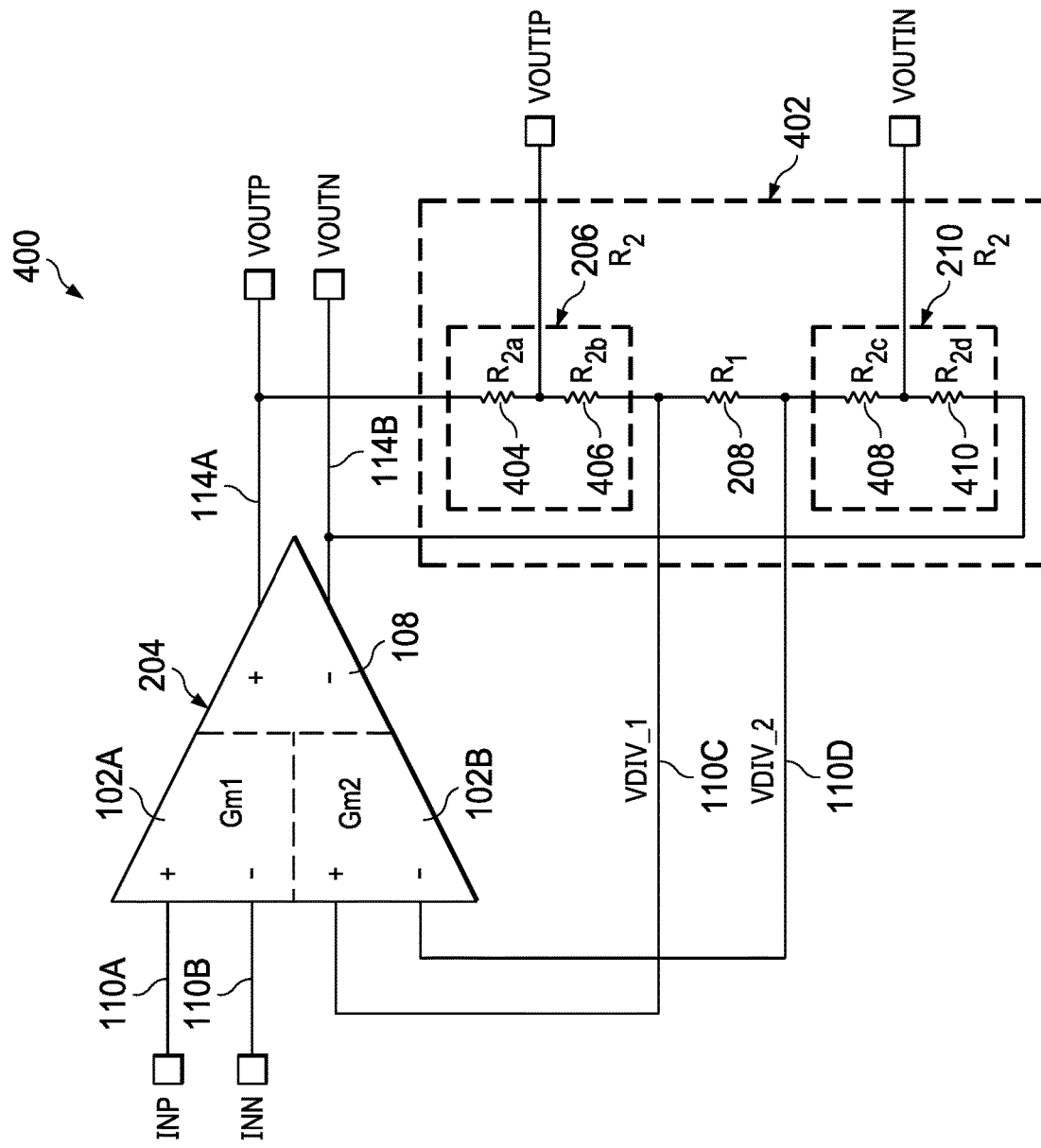
FIG. 4 is a schematic diagram of another embodiment of amplifier-based system circuit that includes a DDA connected to a feedback loop circuit.

FIG. 4 is a schematic diagram of another embodiment of amplifier-based system circuit 400 that includes a DDA 204 connected to a feedback loop circuit 402. The feedback loop circuit 402 differs from the feedback loop circuit 202 shown in FIG. 2 in that the feedback loop circuit 402 is able to provide other output voltages signals besides Voutp and Voutn. Stated another way, rather than tapping output voltage signals at one of the ends of resistors 206 and 210, the feedback loop circuit 402 is able to provide additional scaled output voltage signals (e.g., Vout1p and Vout1n). To provide additional scaled output voltage signals, the feedback loop circuit 402 may split up resistors 206 and 210 into multiple segments. The closed loop gain for DDA 204 can also be defined as shown in equation 1.

As shown in FIG. 4, to generate scaled output voltage signals Vout1p and Vout1n, the feedback loop circuit's resistor 206 is split up into segments 404 and 406 with resistance values of R2a and R2b, and resistor 210 is also split up into segments 408 and 410. The sum of resistance values R2a and R2b equals resistance value R2, and the sum of resistance values of R2c and R2d also equals resistance value R2. The resistance values R2a, R2b, R2c, and R2d may be all set to have the same resistance value or have one or more of the resistance values that differ. For example, resistance values R2a and R2b may have different resistance values, but resistance values R2a and R2c may have the same resistance values. Other embodiments of feedback loop circuit 402 may split up resistors 206 and 210 in more than two segments.

Although FIGS. 2 and 4 illustrate specific embodiments of a feedback loop circuits 202 and 402 that produces a closed loop gain as defined in equation 1, the disclosure is not limited to the specific embodiment illustrated in FIGS. 2 and 4. As an example, although FIG. 2 illustrates that resistors 206 and 210 have about the same resistance values, other embodiments may have resistors 206 and 210 differ in resistance values. The feedback loop circuit 202 could also include more than three components and include other components not explicitly shown in FIG. 2 that are known by persons of ordinary skill in the art and typically found in feedback loops. Examples of the types of components that may found within the feedback loop circuits 202 and 402 include other passive components, such as capacitors. The use and discussion of FIGS. 2 and 4 are only an example to facilitate ease of description and explanation.

Figure 3:
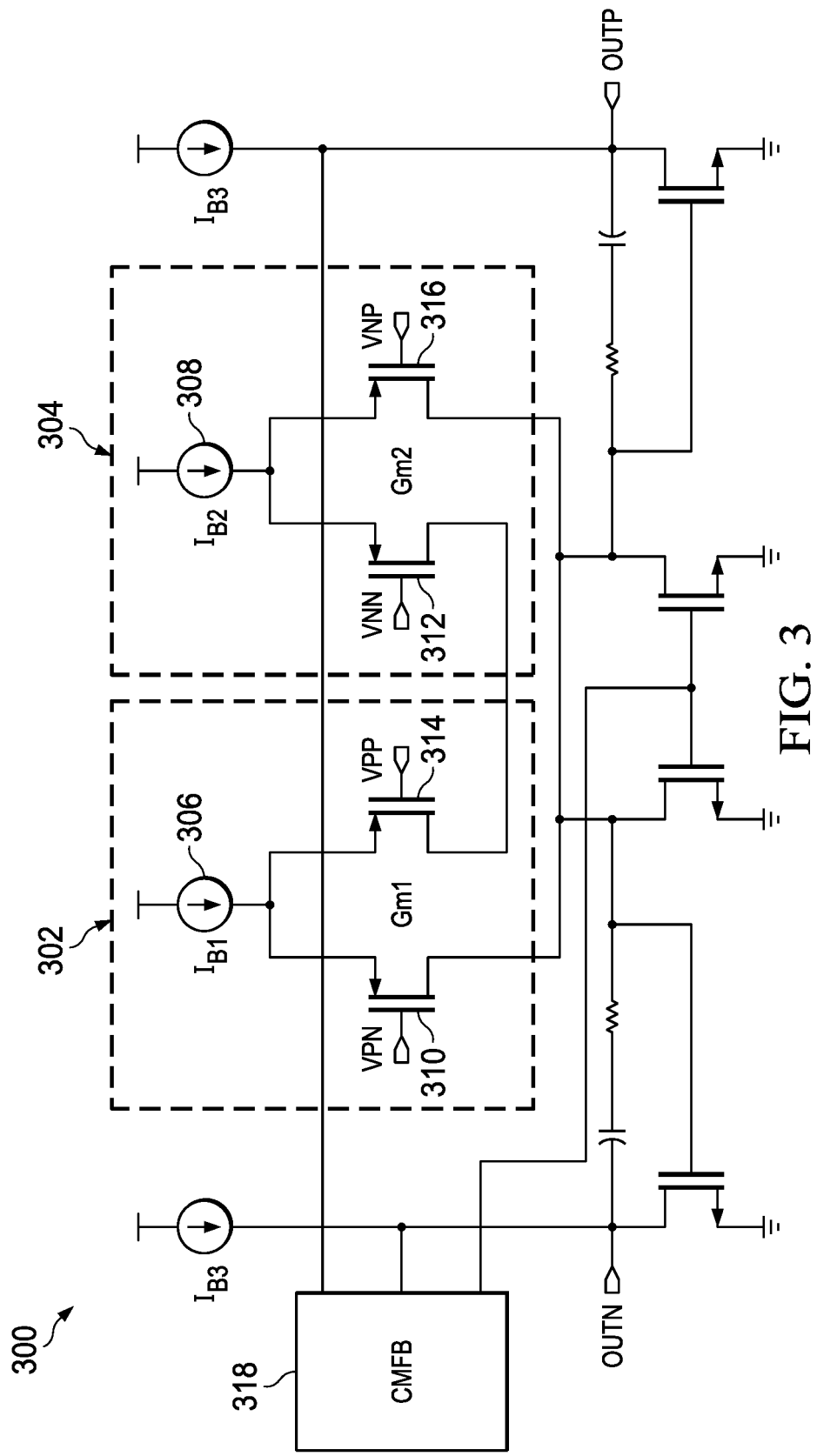
FIG. 3 is a schematic diagram of an embodiment of an input stage found within a DDA.

FIG. 3 is a schematic diagram of an embodiment of an input stage 300 found within a DDA. Using FIG. 1 as an example, the input stage 300 can be part of and/or correspond to the input stage circuits 102A and 102B shown in FIG. 1. In FIG. 3, input stage 300 can contribute a substantial amount of noise, such as thermal noise, that may affect the DDA's performance. In particular, the input transistors 310, 312, 314, and 316 within the input stage 300 may be the source of the noise. Equations 2-5 define the current and voltage noises from the input transistors 310, 312, 314, and 316.

$$I_{n1}^2 = 4kT\gamma G_{m1} \quad (2)$$

$$V_{n1}^2 = 4kT\gamma/G_{m1} \quad (3)$$

$$I_{n2}^2 = 4kT\gamma G_{m2} \quad (4)$$

$$V_{n2}^2 = 4kT\gamma/G_{m2} \quad (5)$$

In equations 2-5, the variable "k" represents the Boltzman constant ($1.38*10^{-23}$ Joules/Kelvin); T represents the current temperature in Kelvins; the variable "γ" represents a coefficient set depending on the length of the channel for transistors (e.g., set as ⅔ for long-channel transistors or a larger value (e.g., 2.5) for submicron transistors); Gm1 represents the transconductance determined from sub-circuit 302; and Gm2 represents the transconductance determined from sub-circuit 303. The "$I_{n1}^2$" variable refers to the current thermal noise from input transistors 310 and 314, and the "$I_{n2}^2$" variable refers to the current thermal noise from input transistors 312 and 316. "$V_{n1}^2$" variable refers to the voltage thermal noise from the input transistors 310 and 314, and the "$V_{n2}^2$" variable refers to the voltage thermal noise from the input transistors 312 and 316. Based on equations 2-5, the overall input referred noise of from input transistors 310, 312, 314, and 316, $V_{in,n}^2$ is shown in equations 6 and 7.

$$V_{in,n}^2 = \frac{4kT\gamma}{G_{m1}} + \frac{G_{m2}^2}{G_{m1}^2}\frac{4kT\gamma}{G_{m2}} \quad (6)$$

$$V_{in,n}^2 = 4kT\gamma\left(\frac{1}{G_{m1}} + \frac{G_{m2}}{G_{m1}^2}\right) \quad (7)$$

In FIG. 3, input stage 300 can be setup to reduce noise and improve gain by shifting the transconductance Gm1 and/or Gm2 values. To set and/or modify the Gm1 and Gm2 values, a circuit designer is able to adjust the bias currents $I_{B1}$ and $I_{B2}$ generated from the current sources 306 and 308, respectively and transistor sizes of the input transistors 310, 312, 314, and 316 in sub-circuits 302 and 304. Equations 8 and 9 shown below provide expressions that define how bias currents $I_{B1}$ and $I_{B2}$ and transistor sizes of the input transistors 310, 312, 314, and 316 affect the transconductance Gm1 and Gm2 values.

$$G_{m1} = \sqrt{2\mu C_{ox}\frac{W_1}{L_1}I_{B1}} \quad G_{m2} = \sqrt{2\mu C_{ox}\frac{W_2}{L_2}I_{B2}} \quad (8)$$

$$\frac{G_{m1}}{G_{m2}} = \sqrt{\frac{W_1}{W_2}\frac{I_{B1}}{I_{B2}}} \quad (\text{Assuming } L_1 = L_2) \quad (9)$$

In equations 8 and 9, variable "$\mu C_{ox}$" represents a transistor constant associated with the fabrication technology, variable "$W_1$" represents the width dimension and variable "$L_1$" represents the length dimension for the input transistors 310 and 314; variable "$W_2$" represents the width dimension and variable "$L_2$" represents the length dimension for the input transistors 312 and 316; variable $I_{B1}$ represents the bias current generated from current source 306, and $I_{B2}$ represents the bias current generated from current source 308.

From equations 8 and 9, to increase the transconductance Gm1 value, a circuit designer is able to modify the current source 306 to produce more bias current, increase the sizes of the input transistors 310 and 314 (e.g., width of transistors 310 and 314), or both. To prevent an overall increase in size and bias current for the input stage, a circuit designer may decrease the transconductance Gm2 value. To decrease the transconductance Gm2 value, the current source 306 can be configured to produce relatively less bias current, decrease the size of the input transistors 312 and 316 (e.g., width of input transistors 312 and 316), or both. Example embodiments of shifting of transconductance Gm1 and/or Gm2 values could have the Gm1 value set to be about two or about four times as large as the Gm2 value. Based on equation 9, for the Gm1 value to be four times as large as the Gm2 value, the bias current $I_{B1}$ and width of the input transistors 310 and 314 can be set to be each four times as large as transistors 312 and 316.

In FIG. 3, the input transistors 310, 312, 314, and 316 are shown to be p-channel metal-oxide semiconductor field-effect (PMOS) transistors. Although the input stage 300 utilizes PMOS transistors for input transistors 310, 312, 314, and 316, the disclosure should not be limited to the PMOS transistors. Instead, the input transistors 310, 312, 314, and 316 may be implemented using a variety of different types of FETs. For example, the input transistors 310, 312, 314, and 316 could be enhanced n-channel metal-oxide semiconductor field-effect (NMOS) transistors. In other examples, the input transistors 310, 312, 314, and 316 could be other types of electrical components, such as p-type junction gate field-effect transistors (PJFETs), n-type junction gate field-effect transistors (NJFETs), and/or bipolar junction transistors (BJTs).

FIG. 3 also depicts that the input stage 300 includes other common and/or well-known components that relate to designing and implementing an amplification stage, such as the common-mode feedback (CMFB) circuit 318. For explanation purposes, because the DDA that contains the input stage 300 is configured to be a fully differential amplifier, the CMFB circuit 318 may be added to stabilize one or more operating points of the DDA. As an example, the CMFB circuit 318 is able to sense the output levels of the input stage 300 (e.g., Outn and Outp shown in FIG. 3) and accordingly adjust one or more of the bias currents in the input stage 300 (e.g., bias current $I_{B3}$). After sensing the output levels, the CMFB circuit 318 may perform a comparison with a reference and return the error to the DDA's bias circuit. Persons of ordinary skill in the art are aware that a variety of CMFB circuit designs can be used to create the CMFB circuit 318. Moreover, components shown in FIG. 3 offer a simplified diagram of the input stage 300 and does not depict all circuit components and /or variations to implement the input stage. Stated another way, the input stage 300 could include other components that account for variety of design considerations that include, but are not limited to, balancing processing speed and power tradeoffs.

Figure 5:
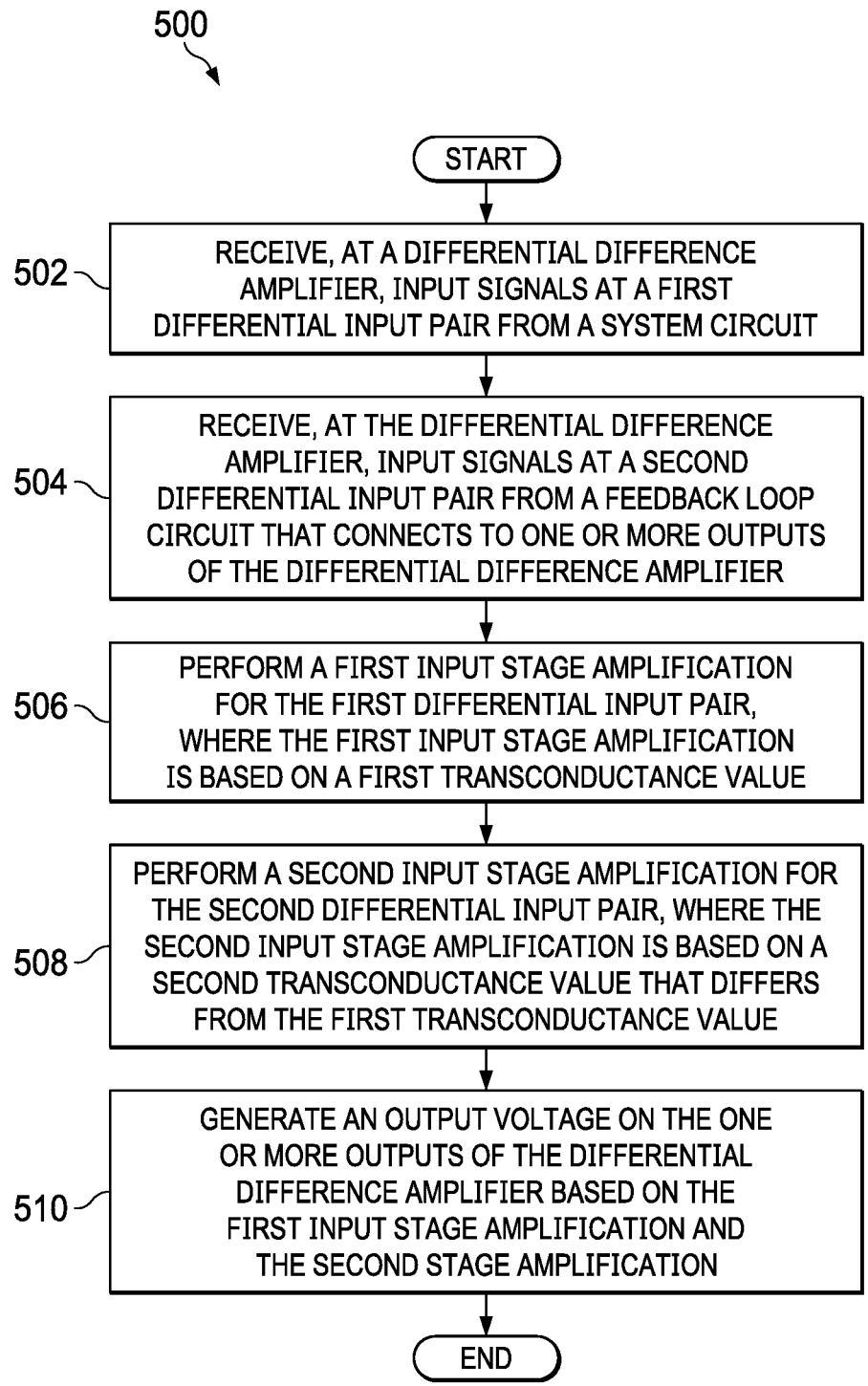
FIG. 5 is a flow chart of an embodiment of a method to reduce noise associated with a DDA.

FIG. 5 is a flow chart of an embodiment of a method 500 to reduce noise associated with a DDA. Using FIGS. 1-3 as examples, method 500 can be implemented using the DDA 104 and 204 and the input stage 300. In one or more embodiments, method 500 is specifically implemented by shifting the transconductance Gm1 and/or Gm2 values shown in FIG. 3 to improve gain and reduce noise. Although FIG. 5 illustrates that the blocks of method 500 are implemented in a sequential operation, method 500 is not limited to this order of operations, and instead other embodiments of method 500 may have one or more blocks implemented in parallel operations. For example, blocks 506 and 508 can be implemented sequentially or in parallel.

Method 500 starts at block 502 and receives, at a DDA, input signals at a first differential input pair from an amplifier-based system circuit. The first differential input pair receives input signals on two different input terminals associated with a first input stage. The first differential input pair is not coupled to a feedback loop circuit. Using FIG. 2 as an example, the first differential input pair receives input signals INP and INN. Method 500 then moves to block 504 and receives, at the DDA, input signals at a second differential input pair from a feedback loop circuit that connects to one or more outputs of the DDA. Pursuant to FIG. 2, the second differential input pair would correspond to Vdiv_1 and Vdiv_2. Recall that method 500 can generate Vdiv_1 and Vdiv_2 based on a series of resistors found within the feedback loop circuit. Based on DDA's configuration, method 500 is able to generate an overall gain of the DDA as previously defined by equation 1.

Method 500 continues to block 506 and performs a first input stage amplification for the first differential input pair, where the amplification is based on the first transconductance value Gm1. Recall that the transconductance value Gm1 can be set according to bias current for the input transistors of the differential input pair and/or the size of the input transistors. Method 500 then moves to block 508 and performs a second input stage amplification for the second differential input pair, where the second input stage amplification is based on the second transconductance value Gm2. To reduce noise, method 500 may have the first transconductance value Gm1 set to be larger than the second transconductance value Gm2. Additionally or alternatively, method 500 may reduce the second transconductance value Gm2 to prevent increases in overall current consumption and/or device size. Example embodiments could have method 500 set Gm1 to be twice or four times as large as Gm2. Afterwards, method 500 moves to block 510 and generates an output voltage on the one or more outputs of the DDA based on the first input stage amplification and the second stage amplification. The closed loop gain of the output voltage is defined as equation 1.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). The use of the term "about" means±10% of the subsequent number, unless otherwise stated.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise.

What is claimed is:

1. A circuit comprising:
   first differential input pair terminals and second differential input pair terminals;
   a first input stage circuit having inputs connected to the first differential input pair terminals and having a first output, the first input stage circuit being configured with a first transconductance value;
   a second input stage circuit having inputs connected to the second differential input pair terminals and having a second output, the second input stage circuit being configured with a second transconductance value that is less than the first transconductance value;

a transimpedance circuit having inputs coupled to the first output and the second output, and having a pair of transimpedance outputs; and a feedback loop coupled to the pair of transimpedance outputs and to the second differential input pair terminals, the feedback loop circuit is not connected to the first differential input pair terminals.

2. The circuit of claim 1, in which the feedback loop circuit comprises a first resistor, a second resistor, and a third resistor coupled in series between the pair of transimpedance outputs.

3. The circuit of claim 2 in which a connection between the first resistor and the second resistor is coupled to a non-inverting input terminal of the second differential input pair terminals.

4. The circuit of claim 3 in which a connection between the second resistor and the third resistor is coupled to an inverting input terminal of the second differential input pair terminals.

5. The circuit of claim 2 in which the first resistor and third resistor have a same resistance value.

6. The circuit of claim 2 in which a closed loop gain of the circuit is based on the first transconductance value, the second transconductance value, a resistance value of the first resistor, a resistance value of the second resistor, and a resistance value of the third resistor.

7. The circuit of claim 1 in which input transistors of the first input stage circuit are sized four times larger than input transistors of the second input stage circuit.

8. The circuit of claim 1 in which bias current for input transistors of the first input stage circuit are four times larger than bias current for input transistors of the second input stage circuit.

9. The circuit of claim 1 in which the first transconductance value is from two to four times larger than the second transconductance value.

10. An amplifier-based system circuit comprising:
a first input stage circuit configured with a first transconductance value;
a second input stage circuit configured with a second transconductance value that is less than the first transconductance value;
a transimpedance circuit having outputs and being configured to receive one or more outputs from the first input stage circuit and the second input stage circuit; and
a feedback loop circuit configured to provide input signals from the outputs of the transimpedance circuit to a first terminal of the second input stage circuit,
the first input stage circuit being configured to not receive input signals from the feedback loop circuit.

11. The amplifier-based system circuit of claim 10 in which the transimpedance circuit is configured to generate a first output voltage and a second output voltage.

12. The amplifier-based system circuit of claim 11 in which the feedback loop circuit is configured to generate the input signals for the first terminal of the second input stage circuit based on the first output voltage and the second output voltage.

13. The amplifier-based system circuit of claim 10 in which input transistors of the first input stage circuit are sized two times larger than input transistors of the second input stage circuit.

14. The amplifier-based system circuit of claim 10 in which bias current for input transistors of the first input stage circuit are two times larger than bias current for input transistors of the second input stage circuit.

15. The amplifier-based system circuit of claim 10 in which the first transconductance value is two times larger than the second transconductance value.

16. The circuit of claim 10 in which the first transconductance value is from two to four times larger than the second transconductance value.

17. A method comprising:
receiving, at an amplifier, a first set of input signals at e first differential input pair terminals, in which the first set of input signals are not from a feedback loop circuit;
receiving, at the amplifier, a second set of input signals at second differential input pair terminals, in which the second set of input signals are from the feedback loop circuit;
performing, at the amplifier, a first input stage amplification for the first differential input pair terminals, in which the first input stage amplification is based on a first transconductance value; and
performing, at the amplifier, a second input stage amplification for the first differential input pair terminals, in which the second input stage amplification is based on a second transconductance value that is less than the first transconductance value; and
generating, at the amplifier, one or more output voltages based on the first input stage amplification and the second input stage amplification.

18. The method of claim 17 in which bias current for input transistors of the first input stage amplification is larger than bias current for input transistors of the second input stage amplification.

19. The method of claim 18 in which the one or more output voltages is based on a closed loop gain determined from the first transconductance value and the second transconductance value.

20. The method of claim 17 including dividing, at the feedback loop circuit, the one or more output voltages to generate a first voltage divider value and a second voltage divider value used to provide the second set of input signals.

* * * * *